(12) United States Patent
Kim

(10) Patent No.: US 7,776,738 B2
(45) Date of Patent: Aug. 17, 2010

(54) METHOD FOR FABRICATING A STORAGE ELECTRODE OF A SEMICONDUCTOR DEVICE

(75) Inventor: Tai Ho Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 640 days.

(21) Appl. No.: 11/770,980

(22) Filed: Jun. 29, 2007

(65) Prior Publication Data
US 2008/0070375 A1    Mar. 20, 2008

(30) Foreign Application Priority Data
Sep. 18, 2006    (KR) .................. 10-2006-0090337

(51) Int. Cl.
*H01L 21/4763*    (2006.01)
(52) U.S. Cl. .................. 438/637; 257/E21.585
(58) Field of Classification Search .................. 438/624, 438/637, 638, 672; 257/E21.585, E21.579
See application file for complete search history.

(56) References Cited

U.S. PATENT DOCUMENTS 6,528,368 B1 *   3/2003   Park .................. 438/253
6,911,364 B2     6/2005   Oh et al.
7,161,205 B2     1/2007   Choi et al.

FOREIGN PATENT DOCUMENTS

| KR | 1020020070730 A | 9/2002 |
| KR | 1020050116314 A | 12/2005 |

* cited by examiner

*Primary Examiner*—David Vu
(74) *Attorney, Agent, or Firm*—Marshall, Gerstein & Borun LLP

(57) ABSTRACT

A method for fabricating a storage electrode of a semiconductor device includes forming an interlayer dielectric film including a storage node contact on a semiconductor substrate, forming an etching blocking layer on the interlayer dielectric film, forming a mold insulating layer on the etching blocking layer, the mold insulating layer including sequentially deposited phospho-silicate glass and high density plasma oxide, forming a hard mask layer on the mold insulating layer, forming an opening in the resulting structure, thereby exposing the surface of the storage node contact, etching the mold insulating layer exposed through the opening to form a variable-profile storage electrode pattern and forming a storage electrode along the surface of the variable-profile storage electrode pattern.

7 Claims, 2 Drawing Sheets

METHOD FOR FABRICATING A STORAGE ELECTRODE OF A SEMICONDUCTOR DEVICE

CROSS-REFERENCE TO RELATED APPLICATION

Priority to Korean patent application number 10-2006-0090337, filed on Sep. 18, 2006, the disclosure of which is incorporated by reference in its entirety, is claimed.

BACKGROUND OF THE INVENTION

The invention relates to a method for fabricating a semiconductor device. More specifically, the invention relates to a method for fabricating a storage electrode of a semiconductor device.

The reduction of the design rule for semiconductor memory devices has brought about technical difficulties in fabricating memory devices within a limited area. For example, it is difficult to fabricate dynamic random access memory (DRAM) devices comprising a plurality of memory cell units each including a transistor and a capacitor while ensuring a sufficient capacitance within a limited area.

To ensure continuous data storage in volatile memory (e.g., DRAM) devices, electrical charges must be periodically introduced into cells, a process referred to as a "refresh" process. The refresh process requires high power consumption, thus disadvantageously affecting mobile products. In an attempt to solve this problem, prolongation of the period between refresh processes has been suggested. The prolongation of the refresh period requires an increase in capacitance (Cs) of the storage capacitor in each cell unit, or a decrease in the parasitic capacitance (Cb) of the cell unit.

To ensure sufficient capacitance of the storage capacitor, various methods directed to increasing the effective surface area of a storage electrode have been considered. First of all, an increased storage electrode height is being preferentially considered. In particular, to obtain an increased effective surface area, trends toward increasingly taller cylinder-type storage electrodes continue.

To obtain an increased effective surface area, there has been suggested a method for forming an uneven electrode pattern via the difference in etching ratio after depositing plasma enhanced tetraorthosilicate (PE-TEOS) on phospho-silicate glass (PSG). However, since the difference in etching ratio between PE-TEOS and PSG is considerably large, a very complicated etching process in the formation of a storage electrode is required. A simplification in the etching process may cause formation of a bridge on the interface between the PE-TEOS and PSG, or permeation of the titanium (Ti) and titanium nitride (TiN) into the interface during subsequent processes. Trends toward lightweight, thin, short and small devices reduce the gap between adjacent storage electrodes, thus making it considerably difficult to solve these problems.

In addition, since PSG is relatively flowable, a reduced storage electrode width results in geometric instability of an electrode pattern, thus causing the "leaning" phenomenon. Accordingly, there has been an increased demand for a method to increase the effective surface area of storage electrodes having a limited height.

BRIEF SUMMARY OF THE INVENTION

The invention provides a method for fabricating a storage electrode of a semiconductor device providing an increased effective surface area for a storage electrode having a limited height without causing any electrode pattern leaning.

In accordance with one aspect of the invention, there is provided a method for fabricating a storage electrode of a semiconductor device including: forming an interlayer dielectric film including a storage node contact over a semiconductor substrate; forming an etching blocking layer on the interlayer dielectric film, thereby covering the interlayer dielectric film and the storage node contact; forming a mold insulating layer on the etching blocking layer, the mold insulating layer including sequentially deposited phospho-silicate glass and high density plasma oxide; forming a hard mask layer on the mold insulating layer; forming an opening in the resulting structure, thereby exposing the surface of the storage node contact; etching the mold insulating layer exposed through the opening to form a variable-profile storage electrode pattern; and forming a storage electrode along the surface of the variable-profile storage electrode pattern.

The step of forming a mold insulating layer may preferably include: forming a first mold layer including phospho-silicate glass (PSG) having a first concentration of phosphorus (P); forming a second mold layer including high density plasma (HDP) oxide; forming a third mold layer including phospho-silicate glass (PSG) having a second concentration of phosphorus (P); and forming a fourth mold layer including high density plasma (HDP) oxide; wherein the first concentration of phosphorous (P) is higher than the second concentration of phosphorous (P).

The method may preferably further include, after the step of forming the fourth mold layer, forming a fifth mold layer including plasma enhanced tetraorthosilicate (PE-TEOS) over the fourth mold layer.

The method may preferably further include, after the step of forming the fifth mold layer, forming a sixth mold layer including high density plasma (HDP) oxide over the fifth mold layer.

The method may preferably further include, prior to the step of forming a mold insulating film on the interlayer insulating film, forming an etching blocking layer on the interlayer dielectric film to prevent the interlayer dielectric film and the storage node contact from being etched; forming the second mold layer at a higher temperature than the fourth mold layer.

BRIEF DESCRIPTION OF THE DRAWINGS

The above and other aspects, features, and advantages of the invention will be more clearly understood from the following detailed description taken in conjunction with the accompanying drawings, in which.

DETAILED DESCRIPTION OF THE INVENTION

The invention provides a method for fabricating a storage electrode of a semiconductor device which provides an increase in the effective surface area of a storage electrode having a limited height without causing any electrode pattern leaning.

Figure 1:
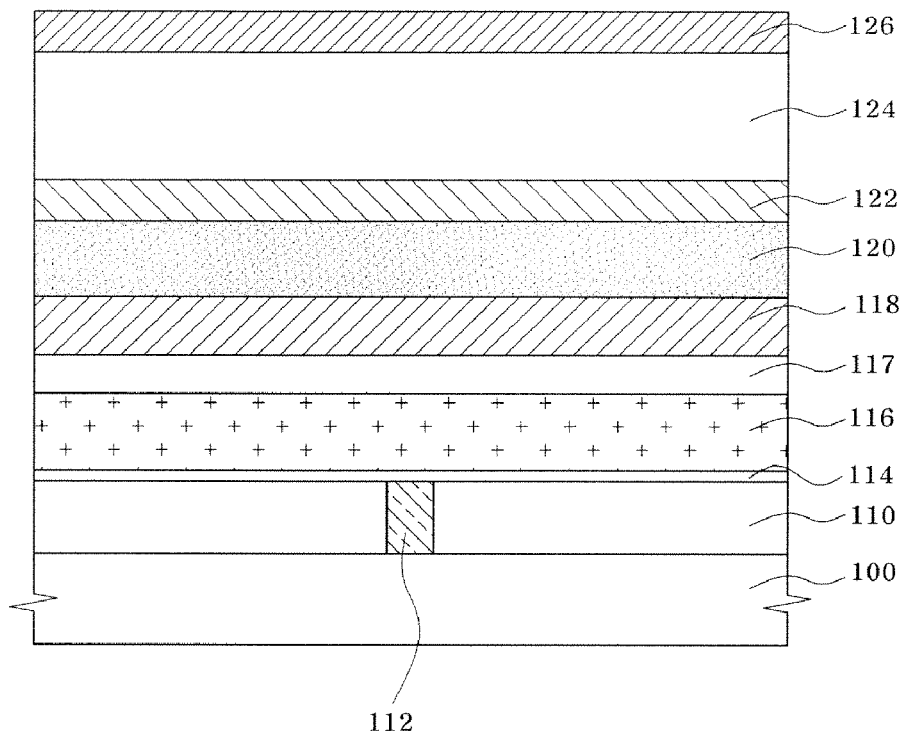
FIGS. 1 to 3 are cross-sectional views illustrating a method for fabricating a storage electrode of a semiconductor device according to one embodiment of the invention.
Figure 2:
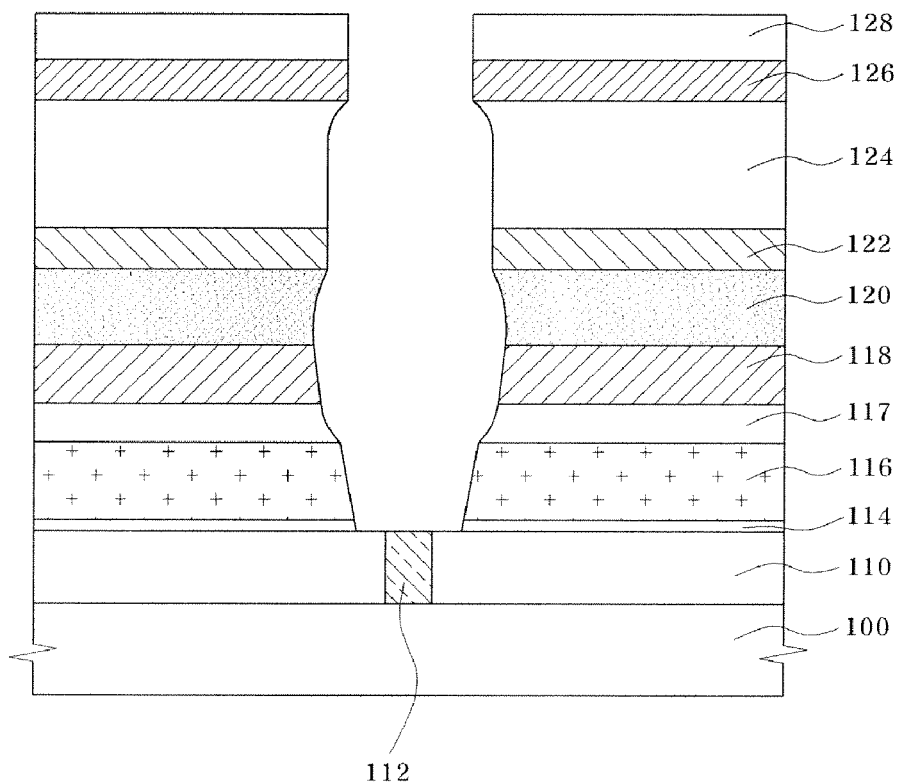
Figure 3:
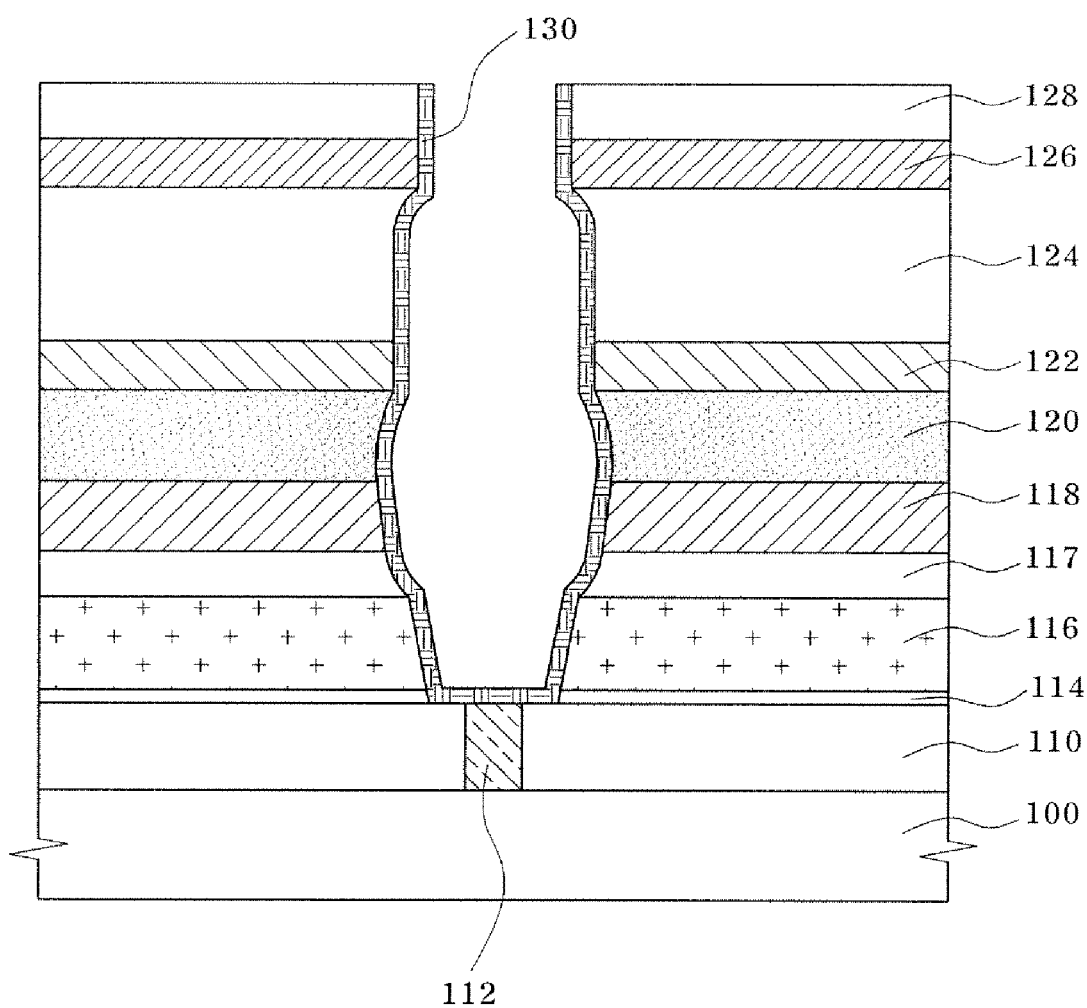

FIGS. 1 to 3 are sectional views illustrating a method for fabricating a storage electrode of a semiconductor device according to one embodiment of the invention.

As shown in FIG. 1, insulating layers to obtain a mold for use in the fabrication of a three-dimensional (e.g., cylinder) storage electrode are formed on a semiconductor substrate 100. First, an interlayer dielectric film 110 to electrically insulate a transistor is formed on the semiconductor substrate 100 where an underlying device such as the transistor is arranged. The interlayer dielectric film 110 is subjected to anisotropic etching to form a contact hole allowing a predetermined region of the transistor to be exposed. The contact hole is filled with a conductive layer made of materials such as doped polysilicon or tungsten silicide (WSi) to form a storage node contact 112 electrically connecting the transistor to the storage electrode.

Next, a silicon nitride layer is deposited on the semiconductor substrate 100 where the storage node contact 112 is arranged, thereby forming an etching blocking layer 114 covering the interlayer dielectric film 110 and the storage node contact 112. The etching blocking layer 114 protects the interlayer dielectric film 110 and the storage node contact 112 by preventing their being etched in a subsequent etching process used in the formation of a storage electrode.

A plurality of insulating layers for forming a mold having a storage electrode shape are deposited on the etching blocking layer 114. When a plurality of insulating layers having different etching rates are sequentially deposited, a variable storage electrode profile can be obtained based on the different etching rates among the insulating layers. According to one embodiment of the invention, a first mold layer 116 and 117 is formed by depositing phospho-silicate glass (PSG) containing a relatively high concentration of phosphorus (p), a second mold layer 118 is formed by depositing high density plasma (HDP) oxide at a high temperature, a third mold layer 120 is formed by depositing phospho-silicate glass (PSG) containing a relatively low concentration of phosphorus (P), a fourth mold layer 122 is formed by depositing high density plasma (HDP) oxide at a low temperature, a fifth mold layer 124 is formed by depositing plasma enhanced tetraorthosilicate (PE-TEOS), and a sixth mold layer 126 is formed by depositing high density plasma (HDP) oxide.

The etching rate of a high density plasma (HDP) oxide is significantly lower than the etching rate of a PSG layer. Accordingly, when an etchant for the oxide is used, a variable-profile electrode structure can be obtained. In addition, the HDP oxide has a high density, thus preventing the leaning of a storage electrode pattern even when it has a relatively small thickness. Since the HDP oxide has superior adhesion properties, it generates no void at the interface between the HDP oxide and the adjacent layer, thus eliminating an underlying cause of device defects, e.g., a bridge or current leakage.

Since the PE-TEOS layer has a high density, it prevents the underlying pattern from being damaged and crushed during the subsequent wet etching step.

Referring to FIG. 2, a nitride, a material having a low selective etching rate relative to the mold insulating layer, is deposited form a hard mask layer 128 for use in the formation of an opening exposing the storage node contact 112. Next, a photoresist pattern (not shown) to expose the storage node contact 112 is formed on the hard mask layer 128. The hard mask layer 128 is patterned by etching through the photoresist pattern serving as a mask. The underlying mold insulating layers and the etching blocking layer 114 are sequentially dry etched through the resulting hard mask layer 128 to form an opening exposing the surface of the storage node contact 112.

The sidewalls of the insulating layers exposed through the opening are etched with a buffered oxide etchant (BOE). The PSG layer 116 containing a high concentration (e.g., 12%) of phosphorus (P) has an etching rate of about 3.6 Å sec upon wet etching with 300:1 BOE. The PSG film 118 containing a low concentration (e.g., 5%) of phosphorus (P) has an etching rate of about 2.7 Å sec upon wet etching with 300:1 BOE. The HDP oxide film has an etching rate of about 0.5 Å sec upon wet etching with 300:1 BOE. The PE-TEOS film has an etching rate of about 1.2 Å sec upon wet etching with 300:1 BOE.

After heating, the PSG layer 116 having a high phosphorous (P) concentration undergoes an about 20% reduction in etching rate. After the deposited PSG layer 116, 117 is subjected to high density plasma (HDP) at a high temperature, the upper PSG layer 117 undergoes a change from a high etching rate to a low etching rate. As a result, etching rate of the upper and lower regions are reversed. When insulating layers having different etching rates are wet-etched, an insulating layer profile where the surface area relatively increases can be obtained as shown in FIG. 2. Based on the low etching rate of the HDP oxide 126 and the hard mask layer 128 each laminated at the top, the resulting storage electrode will have an internal profile in the form of a concave "V" that maintains a small critical dimension (CD), thus providing easy contact.

As shown FIG. 3, a conductive film, (e.g., a doped polysilicon layer) is deposited over the entire surface of the resulting structure. The conductive film is subjected to an etch-back or a chemical mechanical polishing (CMP) process such that the surface of the hard mask layer 128 is exposed to outside, thereby forming a storage electrode 130 in each unit cell. When the hard mask layer 128 and the mold insulation layers are removed, the external and internal surfaces of the storage electrode 130 are included in the effective area of a capacitor, thus enabling an increase in capacitance of the capacitor. Subsequently, a dielectric film (not shown) and a conductive film (not shown) are sequentially deposited and patterned on the resulting structure where the storage electrode 130 is located, thereby forming a dielectric layer and a plate electrode of the capacitor.

As is apparent from the foregoing, the method for fabricating a storage electrode of a semiconductor device includes forming, mold insulating layers by utilizing a variety of characteristics of insulating films. Accordingly, an increase in the effective surface area of the storage electrode can be achieved without increasing the height thereof. In addition, a high density plasma (HDP) oxide and a hard mask layer having a high density and a low etching ratio are laminated at the top, and the storage electrode has an internal profile in the form of a concave "V" while maintaining a substantially small critical dimension (CD). As a result, defects of the storage electrode (e.g., leaning) caused by geometric instability can be prevented.

The embodiments of the invention have been disclosed above for illustrative purposes. Those skilled in the art will appreciate that various modifications, additions and substitutions are possible, without departing from the scope and spirit of the invention as defined in the accompanying claims.

What is claimed is:

1. A method for fabricating a storage electrode of a semiconductor device comprising:
    forming an interlayer dielectric film including a storage node contact over a semiconductor substrate;
    forming an etching blocking layer on the interlayer dielectric film, thereby covering the interlayer dielectric film and the storage node contact;
    forming a mold insulating layer on the etching blocking layer, the mold insulating layer comprising sequentially deposited phospho-silicate glass (PSG) and high density plasma (HDP) oxide;
    forming a hard mask layer on the mold insulating layer;
    forming an opening in the resulting structure, thereby exposing the surface of the storage node contact;

etching the mold insulating layer exposed through the opening to form a variable-profile storage electrode pattern; and forming a storage electrode along the surface of the variable-profile storage electrode pattern;

wherein the step of forming the mold insulating layer comprises: forming a first mold layer comprising phospho-silicate glass (PSG) having a first concentration of phosphorus (P); forming a second mold layer comprising high density plasma (HDP) oxide; forming a third mold layer comprising phospho-silicate glass (PSG) having a second concentration of phosphorus (P); and forming a fourth mold layer comprising high density plasma (HDP) oxide; wherein the first concentration of phosphorous (P) is higher than the second concentration of phosphorous (P).

2. The method according to claim 1, comprising forming the second mold layer at a higher temperature than used to form the fourth mold layer.

3. The method according to claim 1, further comprising: after the step of forming the fourth mold layer, forming a fifth mold layer comprising plasma enhanced tetraorthosilicate (PE-TEOS) over the fourth mold layer.

4. The method according to claim 3, further comprising: after the step of forming the fifth mold layer, forming a sixth mold layer comprising high density plasma (HDP) oxide over the fifth mold layer.

5. The method according to claim 1, wherein the etching blocking layer comprises a nitride.

6. The method according to claim 1, wherein the step of forming a mold insulating layer comprises first depositing the phospho-silicate glass (PSG) and then depositing the high density plasma (HDP) oxide.

7. The method according to claim 1, wherein the step of forming a mold insulating layer comprises first depositing the high density plasma (HDP) oxide and then depositing the phospho-silicate glass (PSG).

* * * * *